United States Patent
Wang et al.

(10) Patent No.: US 12,395,180 B2
(45) Date of Patent: Aug. 19, 2025

(54) SUCCESSIVE APPROXIMATION ANALOG TO DIGITAL CONVERSION CIRCUIT AND METHOD HAVING OPTIMIZED LINEARITY

(71) Applicant: REALTEK SEMICONDUCTOR CORPORATION, Hsinchu (TW)

(72) Inventors: Wei-Jyun Wang, Hsinchu (TW); Kai-Yin Liu, Hsinchu (TW); Shih-Hsiung Huang, Hsinchu (TW); Chien-Ming Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 206 days.

(21) Appl. No.: 18/211,852

(22) Filed: Jun. 20, 2023

(65) Prior Publication Data
US 2023/0421165 A1   Dec. 28, 2023

(30) Foreign Application Priority Data
Jun. 27, 2022  (TW) .................................. 111123880

(51) Int. Cl.
*H03M 1/06*  (2006.01)
(52) U.S. Cl.
CPC ................................. *H03M 1/0604* (2013.01)
(58) Field of Classification Search
CPC .... H03M 1/468; H03M 1/1071; H03M 1/466; H03M 7/165; H03M 1/1038; H03M 5/00;
(Continued)

(56) References Cited

U.S. PATENT DOCUMENTS 7,199,746 B1 *  4/2007  Chowdhury .......... H03M 1/468
                                                              341/172
9,319,059 B1 *  4/2016  Sharma ................. H03M 1/403
(Continued)

OTHER PUBLICATIONS

Lin et al. "Digital-to-analog conversion circuit and method having signal calibration mechanism U.S. Appl. No. 17/861,393" (USPTO receipt date: Jul. 11, 2022), USPTO. 1-1) 17861393_spec 1-2) 17861393_drawing 1-3) 17861393_efilingAck46154872.
(Continued)

*Primary Examiner* — Linh V Nguyen
(74) *Attorney, Agent, or Firm* — WPAT, PC

(57) ABSTRACT

The present invention discloses a SAADC circuit having optimized linearity. A lower-bit capacitor array includes lower-bit capacitors. A higher-bit capacitor array includes unit capacitors. In an initializing mode, a control circuit sorts the unit capacitors according to unit capacitances thereof such that the unit capacitors are configured to be higher-bit capacitors having a linearity parameter within a predetermined range. In an operation mode, the capacitor array receives an analog input signal and a reference voltage to generate an analog output signal, a comparator generates a comparison result according to the analog output signal and the control circuit generates an enabling signal according to the comparison result based on the successive approximation mechanism to selectively enable the higher-bit and the lower-bit capacitors to connect to the reference voltage by using the capacitor enabling circuit and outputs a digital output signal according to the final comparison result.

18 Claims, 6 Drawing Sheets

(58) Field of Classification Search
CPC ...... H03M 1/1245; H03M 1/46; H03M 1/462;
H03M 1/002; H03M 1/0609; H03M
1/0665; H03M 1/0836; H03M 1/121;
H03M 1/1215; H03M 1/123; H03M 1/14;
H03M 1/181; H03M 1/68; H03M 1/804;
H03M 1/00; H03M 1/007; H03M 1/0641;
H03M 1/0673; H03M 1/0695; H03M
1/1042; H03M 1/1047; H03M 1/109;
H03M 1/12; H03M 1/145; H03M 1/365;
H03M 1/56; H03M 1/687; H03M 1/806
USPC .................................. 341/118–122, 155, 172
See application file for complete search history.

(56) References Cited

U.S. PATENT DOCUMENTS

| | | | | |
|---|---|---|---|---|
| 9,432,037 | B2* | 8/2016 | Oh | H03M 1/06 |
| 9,432,044 | B1* | 8/2016 | Lee | H03M 1/1061 |
| 9,654,131 | B1* | 5/2017 | Fuchs | H03M 1/1038 |
| 9,912,341 | B2* | 3/2018 | Draxelmayr | H03M 1/0692 |
| 10,135,457 | B2* | 11/2018 | Chang | H03M 1/466 |
| 10,868,558 | B1* | 12/2020 | Tripurari | H03M 1/462 |
| 10,903,843 | B1* | 1/2021 | Monangi | H03M 1/0665 |
| 11,206,038 | B2* | 12/2021 | Etou | H03M 1/0665 |
| 2015/0263756 | A1* | 9/2015 | Chiu | H03M 1/08 |
| | | | | 341/172 |
| 2016/0126967 | A1* | 5/2016 | Oh | H03M 1/66 |
| | | | | 341/118 |
| 2017/0250699 | A1* | 8/2017 | Fuchs | H03M 1/466 |
| 2019/0131998 | A1 | 5/2019 | Fan | |
| 2020/0343901 | A1* | 10/2020 | Etou | H03M 1/462 |
| 2021/0058091 | A1* | 2/2021 | Fan | H03M 1/1033 |

OTHER PUBLICATIONS

Tao Zeng and Degang Chen, "New calibration technique for current-steering DACs" Proceedings of 2010 IEEE International Symposium on Circuits and Systems, 2010, pp. 573-576, doi: 10.1109/ISCAS.2010.5537534.

T. Chen and G. G. E. Gielen, "A 14-bit 200-MHz Current-Steering DAC With Switching-Sequence Post-Adjustment" Calibration IEEE Journal of Solid-State Circuits, vol. 42, No. 11, pp. 2386-2394, Nov. 2007, doi: 10.1109/JSSC.2007.906200.

OA letter of a counterpart TW application (appl. No. 111123880) mailed on Apr. 7, 2023, Summary of the TW OA letter: 1. Claims 1-2 and 9-10 are rejected as allegedly being unpatentable in view of cited reference 1 (US 2019/0131998 A1).2. Claims 3-8 are allowable. Correspondence bewteen claims of TW counterpart application and claims of US application: 1. Claims 1, 2-3, . . . , and 10 in TW counterpart application correspond to claims 1, 2-3, . . . 8, 10 and 11 in US application, respectively.

* cited by examiner

SUCCESSIVE APPROXIMATION ANALOG TO DIGITAL CONVERSION CIRCUIT AND METHOD HAVING OPTIMIZED LINEARITY

BACKGROUND OF THE INVENTION

1. Field of the Invention

The present invention relates to a successive approximation analog to digital conversion circuit and a successive approximation analog to digital conversion method having optimized linearity.

2. Description of Related Art

An analog to digital converter (ADC) is a device to convert a continuous signal in an analog form to a discrete signal in a digital form. A successive approximation analog to digital conversion (SAADC) circuit is a common architecture of the ADC.

Most the current designs of SAADC circuit include capacitor array. However, a capacitance of each of capacitors included in the capacitor array may deviate from an ideal capacitance due to the manufacturing process or the change of environment temperature. A linearity of the conversion becomes non-ideal accordingly. If a higher resolution is required, the accuracy of the ratios among the capacitances of these capacitors is required. How to reduce the non-linearity generated due to the mismatches among the capacitors becomes a challenging issue.

SUMMARY OF THE INVENTION

In consideration of the problem of the prior art, an object of the present invention is to supply a successive approximation analog to digital conversion circuit and a successive approximation analog to digital conversion method having optimized linearity.

The present invention discloses a SAADC circuit having optimized linearity that includes a control circuit, at least one capacitor array and a comparator. The capacitor array includes a lower-bit capacitor array, a higher-bit capacitor array and a capacitor enabling circuit. The lower-bit capacitor array includes a plurality of lower-bit capacitors. The higher-bit capacitor array includes a plurality of unit capacitors each having a unit capacitance approximately equal to each other. The comparator is electrically coupled between the capacitor array and the control circuit. In an initializing mode, the control circuit performs a sorting process on the unit capacitors according to the unit capacitances thereof to generate a sorting result to configure the unit capacitors to be a plurality of higher-bit capacitors according to the sorting result such that a linearity parameter of the higher-bit capacitors is within a predetermined range. In an operation mode, the capacitor array receives an analog input signal and a plurality of reference voltage to generate an analog output signal, the comparator generates a comparison result at least according to the analog output signal and the control circuit generates an enabling signal according to the comparison result based on the successive approximation mechanism to selectively enable the higher-bit capacitors and the lower-bit capacitors to be coupled to one of the reference voltages by using the capacitor enabling circuit and outputs a digital output signal according to the final comparison result.

The present invention also discloses a SSADC method having optimized linearity used in a SSADC circuit, the SSADC circuit including a control circuit, at least one capacitor array and a comparator, the capacitor array including a lower-bit capacitor array, a higher-bit capacitor array and a capacitor enabling circuit, the lower-bit capacitor array including a plurality of lower-bit capacitors, the higher-bit capacitor array including a plurality of unit capacitors each having a unit capacitance approximately equal to each other, the comparator being electrically coupled between the capacitor array and the control circuit, and the SSADC method including following steps. In an initializing mode, a sorting process is performed on the unit capacitors according to the unit capacitances thereof to generate a sorting result by the control circuit. In the initializing mode, the unit capacitors are configured to be a plurality of higher-bit capacitors by the control circuit according to the sorting result such that a linearity parameter of the higher-bit capacitors is within a predetermined range. In an operation mode, an analog input signal and a plurality of reference voltage are received to generate an analog output signal by the capacitor array and a comparison result is generated at least according to the analog output signal by the comparator. In the operation mode, an enabling signal is generated by the control circuit according to the comparison result based on the successive approximation mechanism to selectively enable the higher-bit capacitors and the lower-bit capacitors to be coupled to one of the reference voltages by using the capacitor enabling circuit and outputs a digital output signal according to the final comparison result.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a SAADC circuit and a SAADC method having optimized linearity to sort unit capacitors and configure the sorted unit capacitors with the corresponding residue capacitor by the control circuit such that the higher-bit capacitors configured accordingly have an optimized linearity.

Figure 1A:
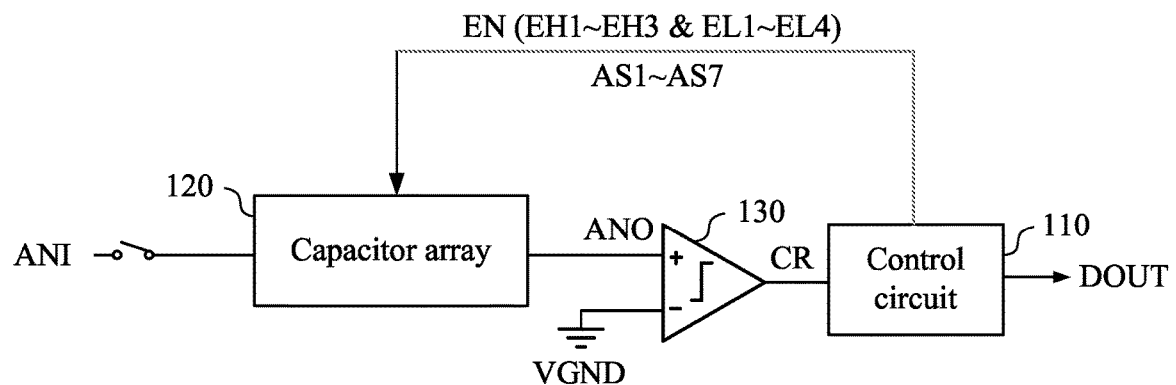
FIG. 1A illustrates a circuit diagram of a SAADC circuit having optimized linearity according to an embodiment of the present invention.

Reference is now made to FIG. 1A. FIG. 1A illustrates a circuit diagram of a SAADC circuit 100 having optimized linearity according to an embodiment of the present invention, in which the SAADC circuit 100 has a single capacitor array configuration.

The SAADC circuit 100 having the single capacitor array configuration includes a control circuit 110, a capacitor array 120 and a comparator 130. The comparator 130 is electrically coupled between the capacitor array 120 and the control circuit 110.

The SAADC circuit 100 having the single capacitor array configuration operates in an initializing mode and an operation mode.

In the initializing mode, the control circuit 110 performs processing according to capacitances of a plurality of capacitors in the capacitor array 120 to determine a configuration of the capacitor array 120.

In the operation mode, the capacitor array 120 receives an analog input signal ANI and a plurality of reference voltages VREF. The reference voltages VREF include positive reference voltages and/or a ground voltage. The control circuit 110 generates an enabling signal EN to enable or disable the capacitors included in the capacitor array 120 such that the capacitor array 120 couples to one of the reference voltages VREF according to the combination of the enabled capacitors and the disabled capacitors to generate the analog output signal ANO. The comparator 130 further performs comparison on the analog output signal ANO and the virtual ground voltage level VGND to generate a comparison result CR.

By using a successive approximation mechanism, the control circuit 110 generates the enabling signal EN according to the comparison result CR to further adjust the capacitor array 120 until the final comparison result CR shows that the analog output signal ANO and the virtual ground voltage level VGND are approximately equal to each other. Under such a condition, a set of digital codes that the enabling signal EN corresponds to is an analog-to-digital conversion result of the analog input signal ANI and is outputted as a digital output signal DOUT.

It is appreciated that in an embodiment, the term "approximately equal" may stand for the condition that a difference between the analog output signal ANO and the reference voltages VREF is smaller than a predetermined level in practical implementation. Such a predetermined level can be an amount of such as, but not limited to a least significant bit (LSB).

Figure 1B:
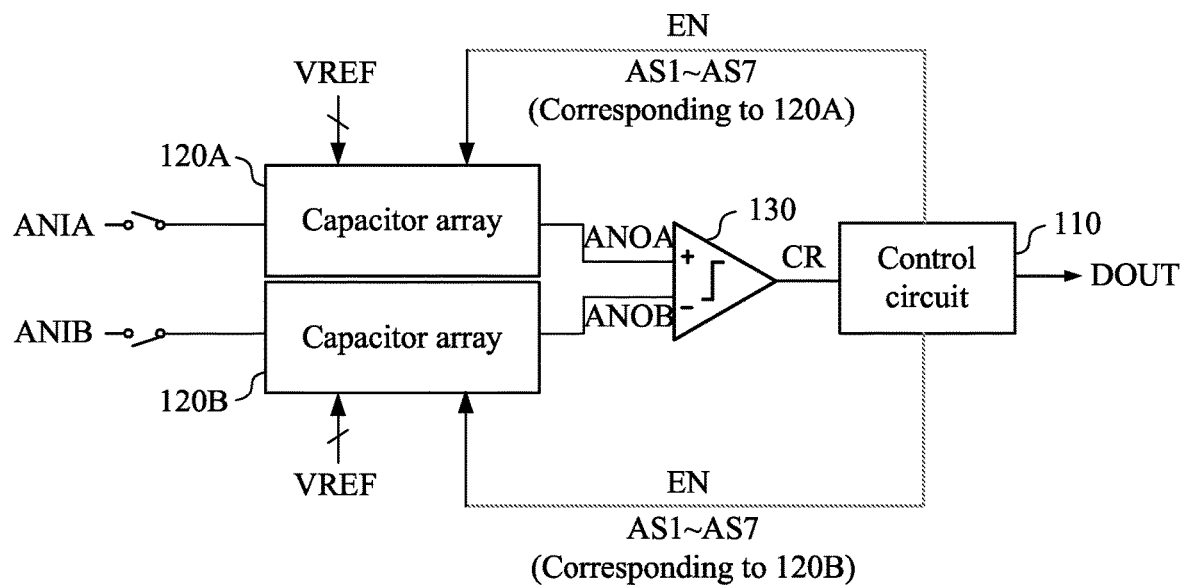
FIG. 1B illustrates a circuit diagram of a SAADC circuit having optimized linearity according to an embodiment of the present invention.

Reference is now made to FIG. 1B. FIG. 1B illustrates a circuit diagram of a SAADC circuit 100' having optimized linearity according to an embodiment of the present invention, in which the SAADC circuit 100' has a differential capacitor arrays configuration.

The SAADC circuit 100' having the differential capacitor arrays configuration includes the control circuit 110, the capacitor array 120A, the capacitor array 120B and the comparator 130. The comparator 130 is electrically coupled between the capacitor array 120A, the capacitor array 120B and the control circuit 110.

The SAADC circuit 100' having the differential capacitor arrays configuration can also operation in the initializing mode and the operation mode.

In the initializing mode, the control circuit 110 performs processing according to capacitances of a plurality of capacitors in the capacitor array 120A and the capacitor array 120B to determine configurations of the capacitor array 120A and the capacitor array 120B.

In the operation mode, the capacitor array 120A and the capacitor array 120B respectively receive an analog input signal ANIA and an analog input signal ANIB, and also respectively receive one or more than one reference voltages VREF. The control circuit 110 generates the enabling signal EN to enable or disable the capacitors included in the capacitor array 120A and the capacitor array 120B. The capacitor array 120A and the capacitor array 120B couple to one of the reference voltages VREF according to the combination of the enabled capacitors and the disabled capacitors to generate an analog output signal ANOA and an analog output signal ANOB respectively. The comparator 130 further performs comparison on the analog output signal ANOA and the analog output signal ANOB to generate the comparison result CR.

By using a successive approximation mechanism, the control circuit 110 generates the enabling signal EN according to the comparison result CR to further adjust the capacitor array 120A and the capacitor array 120B until the final comparison result CR shows that the analog output signal ANOA and the analog output signal ANOB are approximately equal to each other. Under such a condition, a set of digital codes that the enabling signal EN corresponds to is an analog-to-digital conversion result of the analog input signal ANIA and the analog input signal ANIB and is outputted as a digital output signal DOUT. It is appreciated that in an embodiment, the term "approximately equal" may stand for the condition that a difference between the analog output signal ANOA and the analog output signal ANOB is smaller than a predetermined level in practical implementation. Such a predetermined level can be an amount of such as, but not limited to a least significant bit (LSB).

The following paragraphs use the capacitor array 120 in FIG. 1A as an example to illustrate the configuration of the capacitor array 120 and the control and processing that the control circuit 110 performs on the capacitor array 120. Each of the capacitor array 120A and the capacitor array 120B may have a configuration identical to that of the capacitor array 120 and may have an operation identical to that of the capacitor array 120. The detail of the operation of the capacitor array 120A and the capacitor array 120B is not described herein.

Figure 2A:
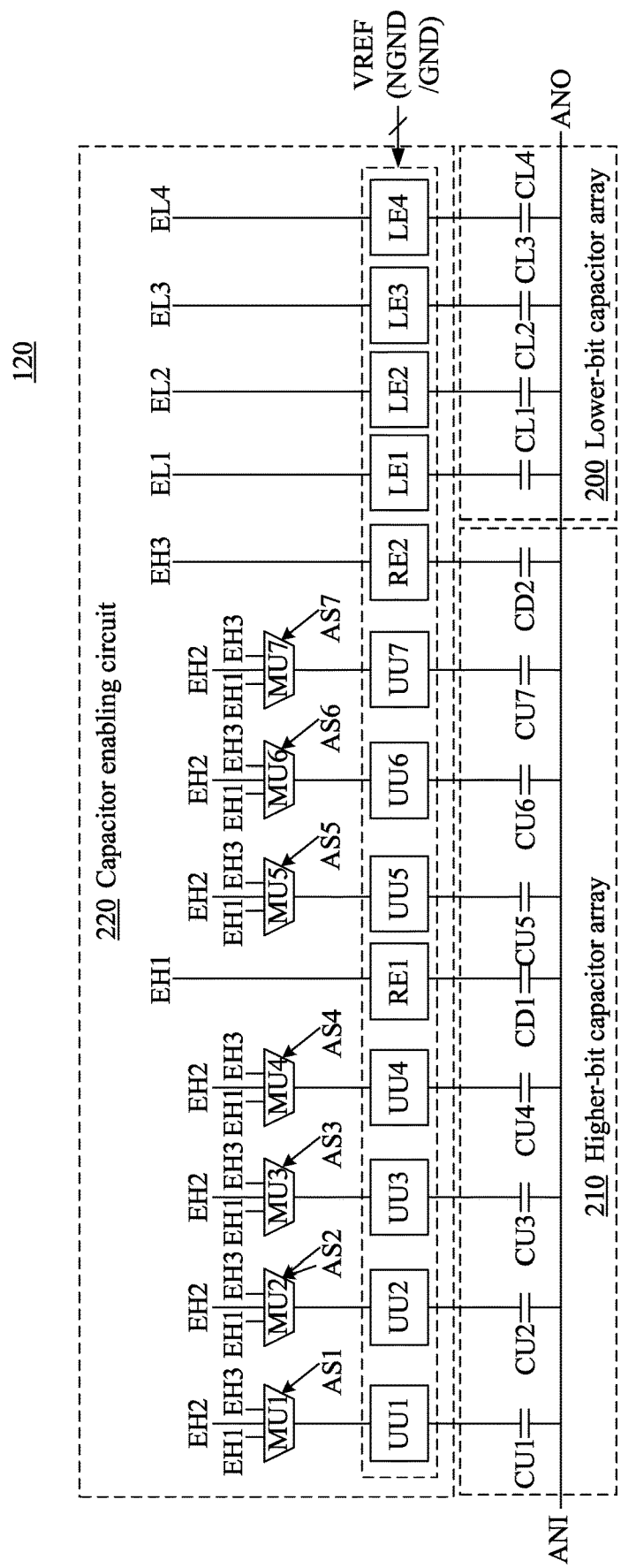
FIG. 2A illustrates a detailed circuit diagram of the capacitor array in FIG. 1A according to an embodiment of the present invention.
Figure 2B:
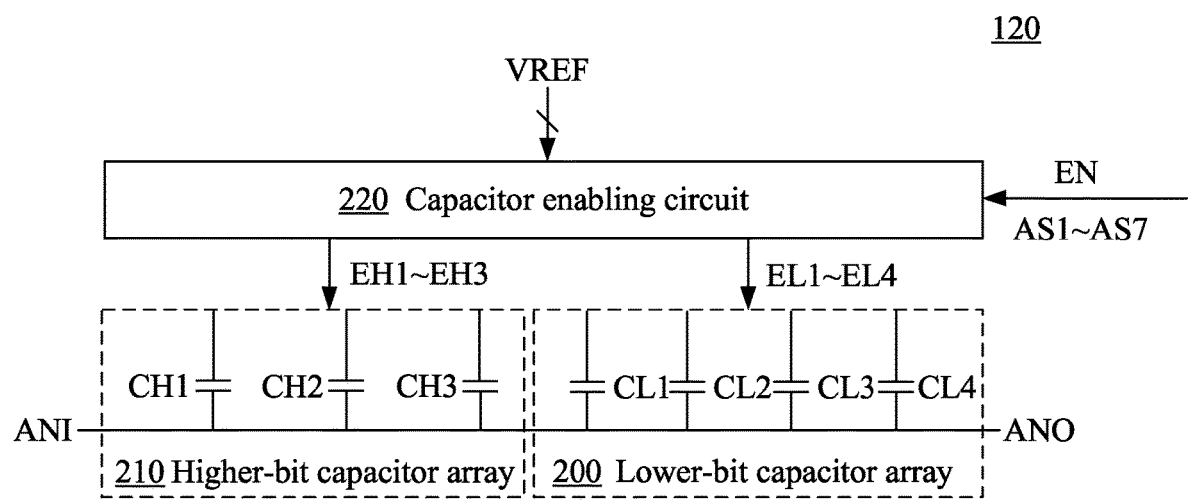
FIG. 2B illustrates an equivalent circuit diagram of the capacitor array in FIG. 2A according to an embodiment of the present invention.

Reference is now made to FIG. 2A and FIG. 2B at the same time. FIG. 2A illustrates a detailed circuit diagram of the capacitor array 120 in FIG. 1A according to an embodiment of the present invention. FIG. 2B illustrates an equivalent circuit diagram of the capacitor array 120 in FIG. 2A according to an embodiment of the present invention. Those skilled in the art can derive the implementation of the capacitor array 120A and the capacitor array 120B in FIG. 1B based on the description of FIG. 2A and FIG. 2B.

The capacitor array 120 includes a lower-bit capacitor array 200, a higher-bit capacitor array 210 and a capacitor enabling circuit 220.

The lower-bit capacitor array 200 includes a plurality of lower-bit capacitors CL1~CL4 each having a different lower-bit capacitance.

As illustrated in FIG. 2A, the higher-bit capacitor array 210 includes a plurality of residue capacitors CD1~CD2 and a plurality of unit capacitors CU1~CU7 that are configured to be a plurality of higher-bit capacitors CH1~CH3 each having a different higher-bit capacitance in FIG. 2B. Each of the unit capacitors CU1~CU7 has a unit capacitance approximately equal to each other. It is appreciated that under an ideal condition, the unit capacitance of each of the unit capacitors CU1~CU7 is identical to each other. As a result, the term "approximately equal" stands for the condition that a reasonable offset exists between the unit capacitances of each two of the unit capacitors CU1~CU7 due to the manufacturing process or the change of environment temperature.

In an embodiment, the residue capacitance of each of the residue capacitors CD1~CD2 is smaller than or equal to the unit capacitance of each of the unit capacitors CU1~CU7. The lower-bit capacitance of each of the lower-bit capacitors CL1~CL4 is smaller than or equal to the higher-bit capacitance of each of the higher-bit capacitors CH1~CH3.

In a numerical example, the unit capacitance that each of the unit capacitors CU1~CU7 has is 7C. The residue capacitance that each of the residue capacitors CD1~CD2 has is 1C. The lower-bit capacitances that the lower-bit capacitors CL1~CL4 have are 6C, 3C, 2C and 1C. It is appreciated that each of the lower-bit capacitances of the lower-bit capacitors CL1~CL4 in the present example is smaller than the unit capacitance of each of the unit capacitors CU1~CU7. However, in practical implementation, each of the lower-bit capacitances of the lower-bit capacitors CL1~CL4 can be larger than or equal to the unit capacitance of each of the unit capacitors CU1~CU7.

It is appreciated that in the embodiment described above, the residue capacitance of each of the residue capacitor is equal to each other and the lower-bit capacitances of the lower-bit capacitors are different from each other. However, in other embodiments, the residue capacitance of each of the residue capacitor may be different from each other and the lower-bit capacitances of the lower-bit capacitors may be identical to each other.

In the initializing mode, the control circuit 110 in FIG. 1A determines the configuration of the unit capacitors CU1~CU7 and the residue capacitors CD1~CD2 in FIG. 2A to equivalently form the higher-bit capacitors CH1~CH3 in FIG. 2B.

More specifically, in the initializing mode, the control circuit 110 in FIG. 1A performs a sorting process on the unit capacitors CU1~CU7 in FIG. 2A according to the unit capacitances thereof to generate a sorting result to configure the unit capacitors CU1~CU7 and the residue capacitors CD1~CD2 to be the higher-bit capacitors CH1~CH3 in FIG. 2B according to the sorting result, in which each of the higher-bit capacitors CH1~CH3 has a different higher-bit capacitance.

In an embodiment, each of the higher-bit capacitors CH1~CH3 includes at least one of the unit capacitors CU1~CU7 and selectively includes one of the residue capacitors CD1~CD2.

For example, when the higher-bit capacitances of the higher-bit capacitors CH1~CH3 are supposed to be 29C, 14C and 8C, the control circuit 110 can configure four unit capacitors and one residue capacitor to be the higher-bit capacitor CH1 (7×4+1=29), configure two unit capacitors to be the higher-bit capacitor CH2 (7×2=14) and configure one unit capacitor and one residue capacitor to be the higher-bit capacitor CH1 (7+1=8) according to the sorting result.

Based on the configuration generated according to the sorting result, a linearity parameter of the higher-bit capacitors CH1~CH3 is within a predetermined range.

In order to make the capacitor array 120 operate according to the method described above, the control circuit 110 in FIG. 1A needs to perform the sorting process first and enable the capacitors to perform configuration thereto according to the sorting result. The topics of (1) the operation of the sorting process; (2) the enabling of the capacitors; and (3) the optimization of the linearity parameter are described in turn in the following paragraphs.

(1) The operation of the sorting process is described in the following paragraphs first.

The sorting process performed on the unit capacitors CU1~CU7 by the control circuit 110 includes K sorting stages each correspondingly processing a plurality of items to be processed, in which K is an integer larger than or equal to 1. The items to be processed corresponding to the first sorting stage are the unit capacitances of the unit capacitors.

In each of the K sorting stages, the control circuit 110 performs a sorting operation and a combining operation on the items to be processed In a preferable embodiment, the sorting operation sorts a total capacitance of the unit capacitors comprised by each of the items to be processed in ascending order or in descending order to generate a plurality of sorted items. The combining operation combines a plurality pairs of the sorted items to generate a plurality of combined items, in which for each pair of the sorted items, one the sorted items is larger than or equal to a median of the sorted items and the other one of the sorted items is smaller than or equal to the median. The combined items generated in each of the first to the K−1-th sorting stages serve as the items to be processed of a next one of the sorting stages, and the combined items generated in the K-th sorting stages serve as a plurality of items to be allocated.

For each of the K sorting stages as a present sorting stage, after the sorting operation is finished, a specific one of the higher-bit capacitors to be configured that requires an odd number of the sorted items to be allocated thereto is determined as an odd capacitor of the present sorting stage by the control circuit 100. When the number of the odd capacitor in the present sorting stage is more than one, the unit capacitors of at least one of the middlemost sorted items are allocated to the odd capacitor such that the combining operation is performed subsequently. The control circuit 110 allocates the unit capacitors that the items to be allocated generated in the K-th sorting stage corresponds to a plurality of remained non-odd capacitors.

In an embodiment, the control circuit 110 further performs combining operation on the remained final sorted items to generate a plurality of combined items and allocate these combined items to the remained non-odd capacitors.

In an embodiment, whether the combining operation is performed on the sorted items in each of the first sorting stage to the K−1-th sorting stage, or is performed on the final sorted items in the K-th sorting stage, when the number of the sorted items is N, the combining operation performed by the control circuit 110 pairs the A-th sorted item and the N+1-A-th sorted item under the condition that A in turn increments from 1 to $\lfloor N/2 \rfloor$, in which N is a positive integer and $\lfloor N/2 \rfloor$ is a floor function.

The usage scenario illustrated from FIG. 3A to FIG. 3D are used in turn to describe an actual operation of the sorting process.

Reference is now made to FIG. 3A to FIG. 3D. FIG. 3A to FIG. 3D illustrate the sorting process performed on the unit capacitors CU1~CU7 by the control circuit 110 according to the unit capacitances thereof according to an embodiment of the present invention. Each of the unit capacitors CU1~CU7 is illustrated as a rectangular block, and a length of each of the block represent the amount of the unit capacitance thereof.

Figure 3A:
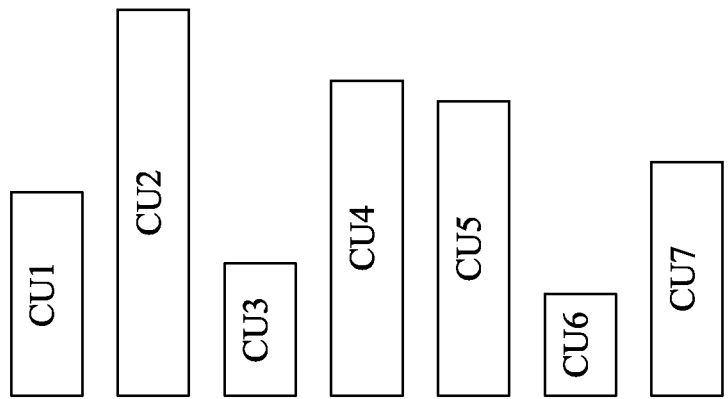
FIG. 3A to FIG. 3D illustrate the sorting process performed on the unit capacitors by the control circuit according to the unit capacitances thereof according to an embodiment of the present invention.
Figure 3B:
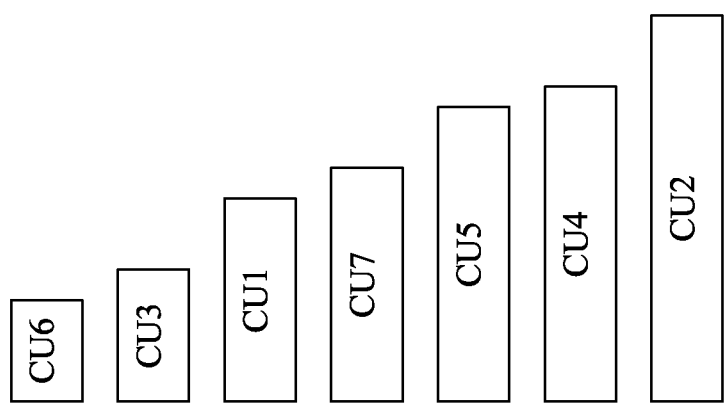

As illustrated in FIG. 3A, the arrangement of the unit capacitances of the unsorted unit capacitors CU1~CU7 is not regular.

The control circuit 110 is configured to perform a 1st sorting stage on the unit capacitors. In the present embodiment, the sorting operation of the 1st sorting stage sorts the items to be processed (i.e., the capacitances of the unit capacitors CU1~CU7) in ascending order to generate the sorted items illustrated in FIG. 3B. More specifically, according to the ascending order, the sorted items include the capacitances of the unit capacitors CU6, CU3, CU1, CU7, CU5, CU4 and CU2, and the number of these items is 7 (N=7).

The control circuit 110 determines that only the higher-bit capacitor CH3 requires an odd number of the sorted items to be allocated thereto (which requires 1 unit capacitor). As a result, the higher-bit capacitor CH3 is determined to be the odd capacitor, and the higher-bit capacitor CH1 and the higher-bit capacitor CH2 are determined to be non-odd capacitors. Under such a condition, the control circuit 110 allocates the unit capacitor corresponding to the middlemost sorted item, i.e., the unit capacitor CU7, to the higher-bit capacitor CH3.

Figure 3C:
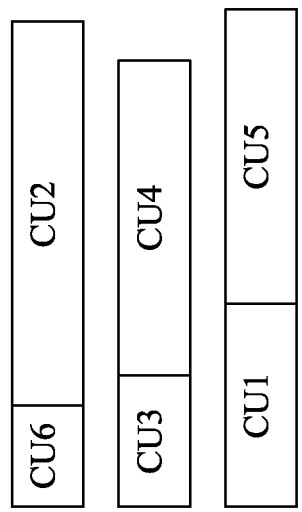
Figure 3D:
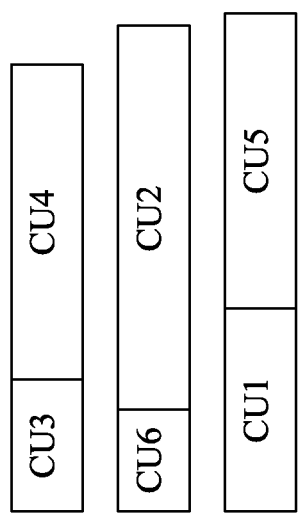

The control circuit 110 further performs combining operation to in turn combine the 1st sorted item (A=1) and the 7th sorted item (N+1-A=7), combine the 2nd sorted item (A=2) and the 6th sorted item (N+1-A=6) and combine the 3rd sorted item (A=3=⌊7/2⌋) and the 5th sorted item (N+1-A=5) to generate the combined items in FIG. 3C. More specifically, these combined items include the unit capacitors CU6 and CU2, the unit capacitors CU3 and CU4 and the unit capacitors CU1 and CU5.

When the sorting process only includes 1 sorting stage (K=1), the combined items generated in the 1st sorting stages are the items to be allocated. The control circuit 110 allocates these items to be allocated (i.e., the 3 combined items including 6 unit capacitors) to the higher-bit capacitor CH1 that requires 4 unit capacitors and the higher-bit capacitor CH2 that requires 2 unit capacitors either randomly or by using a specific allocation method.

On the other hand, when the sorting process includes 2 sorting stages (K=2), the combined items generated by the 1st sorting stage are the items to be processed in the 2nd sorting stages. The sorting operation of the 2nd sorting stage sorts the items to be processed (i.e., the total capacitance of the unit capacitors CU6 and CU2, the total capacitance of the unit capacitors CU3 and CU4 and the total capacitance of the unit capacitors CU1 and CU5) in ascending order to generate the sorted items illustrated in FIG. 3D. More specifically, according to the ascending order, the sorted items include the total capacitance of the unit capacitors CU3 and CU4, the total capacitance of the unit capacitors CU6 and CU2 and the total capacitance of the unit capacitors CU1 and CU5.

Since each of sorted items includes two unit capacitors, in the remained higher-bit capacitors CH1 and CH2 to be configured (in which the higher-bit capacitor CH3 is finished being allocated in the 1st sorting stage), the higher-bit capacitor CH1 requires the unit capacitors corresponding to 2 sorted items (total 4 unit capacitors) and the higher-bit capacitor CH2 requires the unit capacitors corresponding to 1 sorted item (total 2 unit capacitors).

As a result, the control circuit 110 determines that the higher-bit capacitor CH2 is the odd capacitor and the higher-bit capacitor CH1 is the non-odd capacitor.

Similar to the operation in the 1st sorting stage, the control circuit 110 allocates the unit capacitors CU6 and CU2 corresponding to the middlemost sorted item (the total capacitance of the unit capacitors CU6 and CU2) to the higher-bit capacitor CH2.

The control circuit 110 further performs combining operation to combine the 1st sorted item and the 3rd sorted item to generate the combined item that includes the total capacitance of the unit capacitors CU3, CU4, CU1 and CU5, and such a combined item is the item to be allocated. The control circuit 110 allocate the unit capacitors CU3, CU4, CU1 and CU5 that the item to be allocated corresponds to to the higher-bit capacitors CH1.

A plurality of usage scenarios are used in the following paragraphs to describe the operation of the sorting process under the conditions that the capacitors have different numbers.

In the first usage scenario, the number of the higher-bit capacitors is 4 (e.g., CH1~CH4) and the higher-bit capacitors require 11 unit capacitors (respectively require 4, 4, 2 and 1 unit capacitors) to be configured. As a result, after the sorting operation in the 1st sorting process is performed, the higher-bit capacitor CH4 is determined to be the odd capacitor and the unit capacitor that the middlemost sorted item (the 6th sorted item) correspond to is allocated thereto. After the combining operation of the 1st sorting process, the remained 10 unit capacitors are combined in pairs to generate 5 combined items. When the sorting process only includes 1 sorting stage, the 5 combined items serve as the items to be allocated. Two items (4 unit capacitors), 2 items (4 unit capacitors) and 1 item (2 unit capacitors) are respectively allocated to the higher-bit capacitors CH1~CH3 either randomly or by using a specific allocation method.

When the sorting process includes 2 sorting stages, the 5 combined items serve as the items to be processed in the 2nd sorting process to such that the sorting operation is performed thereon. Under such a condition, the higher-bit capacitors CH1~CH3 require the number of the unit capacitors that 2, 2 and 1 sorted items in the current sorting stage correspond to (each of sorted items corresponds to 2 unit capacitors) respectively. The unit capacitors that the middlemost sorted item (the 3rd sorted item) corresponds to are allocated to the higher-bit capacitor CH3 that is the odd capacitor in the sorting current stage. The remained sorted items are combined to generate 2 combined items (each including 4 unit capacitors), wherein the 1st and the 5th sorted items are combined and the 2nd and the 4th sorted items are combined. The 2 combined items serve as the items to be allocated and are respectively allocated to the higher-bit capacitors CH1~CH2 either randomly or by using a specific allocation method.

In the second usage scenario, the number of the higher-bit capacitors is 5 (e.g., CH1~CH5) and the higher-bit capacitors require 13 unit capacitors (respectively require 4, 3, 3, 2 and 1 unit capacitors) to be configured. As a result, after the sorting operation in the 1st sorting process is performed, each of the higher-bit capacitors CH2, CH3 and CH5 is determined to be the odd capacitor and the unit capacitors that the middlemost three sorted items (the 6th to the 8th sorted items, each having one unit capacitor) correspond to are respectively allocated thereto. The higher-bit capacitors CH1~CH5 still require 4, 2, 2, 2 and 0 unit capacitors to be allocated thereto. After the combining operation of the 1st sorting process, the remained 10 unit capacitors are combined in pairs to generate 5 combined items. When the sorting process only includes 1 sorting stage, the 5 combined items serve as the items to be allocated. Two items (4 unit capacitors) are allocated to the higher-bit capacitor CH1 and three single items (each having 2 unit capacitors) are respectively allocated to the higher-bit capacitors CH2~CH4 either randomly or by using a specific allocation method.

When the sorting process includes 2 sorting stages, the 5 combined items serve as the items to be processed in the 2nd sorting process to such that the sorting operation is performed thereon. Under such a condition, the higher-bit capacitors CH1~CH4 require the number of the unit capacitors that 2, 1, 1 and 1 sorted items in the current sorting stage correspond to (each of sorted items corresponds to 2 unit capacitors) respectively. The 2 unit capacitors of each of the middlemost three sorted items (the 2nd to the 4th sorted items) are respectively allocated to the higher-bit capacitors CH2~CH4 determined to be the odd capacitors in the current sorting stage either randomly or by using a specific allocation method. The remained sorted items are combined to generate 1 combined item (having 4 unit capacitors), wherein the 1st and the 5th remained sorted items are combined. The combined item serves as the item to be allocated and is allocated to the higher-bit capacitor CH1.

In the third usage scenario, the number of the higher-bit capacitors is 4 (e.g., CH1~CH4) and the higher-bit capacitors require 14 unit capacitors (respectively require 5, 4, 3 and 2 unit capacitors) to be configured. As a result, after the sorting operation in the 1st sorting process is performed, each of the higher-bit capacitors CH1 and CH3 is determined to be the odd capacitor and the unit capacitors that the middlemost two sorted items (the 7th and the 8th sorted items, each having one unit capacitor) correspond to are respectively allocated thereto. The higher-bit capacitors CH1~CH4 still require 4, 4, 2 and 2 unit capacitors to be allocated thereto. After the combining operation of the 1st sorting process, the remained 12 unit capacitors are combined in pairs to generate 6 combined items. When the sorting process only includes 1 sorting stage, the 6 combined items serve as the items to be allocated. Two items (4 unit capacitors) are allocated to the higher-bit capacitor CH1, two items are allocated to the higher-bit capacitor CH2, a single item is allocated to the higher-bit capacitor CH3 and a single item is allocated to the higher-bit capacitor CH4.

When the sorting process includes 2 sorting stages, the 6 combined items serve as the items to be processed in the 2nd sorting process to such that the sorting operation is performed thereon. Under such a condition, the higher-bit capacitors CH1~CH4 require the number of the unit capacitors that 2, 2, 1 and 1 sorted items in the current sorting stage correspond to (each of sorted items corresponds to 2 unit capacitors) respectively. The 2 unit capacitors of each of the middlemost two sorted items (the 3rd and the 4th sorted items) are respectively allocated to the higher-bit capacitors CH3~CH4 determined to be the odd capacitors in the current sorting stage either randomly or by using a specific allocation method. The remained sorted items are combined to generate 2 combined items (each having 4 unit capacitors), wherein the 1st and the 6th remained sorted items are combined and the 2nd and the 5th remained sorted items are combined. The 2 combined items serve as the items to be allocated and the unit capacitors that the 2 combined items correspond to are respectively allocated to the higher-bit capacitors CH1~CH2.

In the fourth usage scenario, the number of the higher-bit capacitors is 6 (e.g., CH1~CH6) and the higher-bit capacitors require 24 unit capacitors (respectively require 8, 5, 4, 3, 2 and 2 unit capacitors) to be configured. As a result, after the sorting operation in the 1st sorting process is performed, each of the higher-bit capacitors CH2 and CH4 is determined to be the odd capacitor and the unit capacitors that the middlemost two sorted items (the 12th and the 13th sorted items, each having one unit capacitor) correspond to are respectively allocated thereto. The higher-bit capacitors CH1~CH6 still require 8, 4, 4, 2, 2 and 2 unit capacitors to be allocated thereto. After the combining operation of the 1st sorting process, the remained 22 unit capacitors are combined in pairs to generate 11 combined items. When the sorting process only includes 1 sorting stage, the 11 combined items serve as the items to be allocated. Four items (8 unit capacitors) are allocated to the higher-bit capacitor CH1, two items are allocated to the higher-bit capacitor CH2, two items are allocated to the higher-bit capacitor CH3, a single item is allocated to the higher-bit capacitor CH4, a single item is allocated to the higher-bit capacitor CH5 and a single item is allocated to the higher-bit capacitor CH6.

When the sorting process includes 2 sorting stages, the 11 combined items serve as the items to be processed in the 2nd sorting process to such that the sorting operation is performed thereon. Under such a condition, the higher-bit capacitors CH1~CH6 require the number of the unit capacitors that 4, 2, 2, 1, 1 and 1 sorted items in the current sorting stage correspond to (each of sorted items corresponds to 2 unit capacitors) respectively. The 2 unit capacitors of each of the middlemost three sorted items (the 5th to the 7th sorted items) are respectively allocated to the higher-bit capacitors CH4~CH6 determined to be the odd capacitors in the current sorting stage either randomly or by using a specific allocation method. The remained sorted items are combined to generate 4 combined items (each having 4 unit capacitors), wherein the 1st and the 11th remained sorted items are combined, the 2nd and the 10th remained sorted items are combined, the 3rd and the 9th remained sorted items are combined and the 4th and the 8th remained sorted items are combined. The 4 combined items serve as the items to be allocated, in which the unit capacitors that 2 combined items correspond to are allocated the higher-bit capacitor CH1, the unit capacitors that 1 combined item correspond to is allocated the higher-bit capacitor CH2 and the unit capacitors that 1 combined item correspond to is allocated the higher-bit capacitor CH3.

When the sorting process includes 3 sorting stages, the 4 combined items serve as the items to be processed in the 3rd sorting process to such that the sorting operation is performed thereon. Under such a condition, the higher-bit capacitors CH1~CH3 require the number of the unit capacitors that 2, 1 and 1 sorted items in the current sorting stage correspond to (each of sorted items corresponds to 4 unit capacitors) respectively. The 4 unit capacitors of each of the middlemost two sorted items (the 2nd and the 3rd sorted items) are respectively allocated to the higher-bit capacitors CH2~CH3 determined to be the odd capacitors in the current sorting stage either randomly or by using a specific allocation method. The remained sorted items are combined to generate 1 combined item (having 8 unit capacitors), wherein the 1st and the 4th remained sorted items are combined. The combined item serves as the item to be allocated and is allocated to the higher-bit capacitor CH1.

(2) The enabling of the capacitors: after the operation of the sorting process is described, the enabling of the capacitors is described in the following paragraphs in accompany with FIG. 1A and FIG. 2A at the same time.

Reference is now made to FIG. 1A. In the operation mode, the capacitor array 120 receives the analog input signal ANI to generate the analog output signal ANO. The comparator 130 in FIG. 1A performs comparison on the analog output signal ANO and the virtual ground voltage level VGND to generate the comparison result CR. By using a successive approximation mechanism, the control circuit 110 generates the enabling signal EN according to the comparison result CR to selectively enable the higher-bit capacitors CH1~CH3 and the lower-bit capacitors CL1~CL4 by using the capacitor enabling circuit 220 to generate the digital output signal DOUT according to the final comparison result CR.

The enabling signal EN includes a plurality of higher-bit enabling signals EH1~EH3 and a plurality of lower-bit enabling signals EL1~EL4 each having an enabling state and a disabling state. Each of the higher-bit enabling signals EH1~EH3 corresponds to one of the higher-bit capacitors CH1~CH3. Each of the lower-bit enabling signals EL1~EL4 corresponds to one of the lower-bit capacitors CL1~CL4.

As illustrated in FIG. 2A, the capacitor enabling circuit 220 may include a plurality of lower-bit enabling circuit LE1~LE4, a plurality of residue capacitor enabling circuit RE1~RE2, a plurality of multiplexers MU1~MU7 and a plurality of unit capacitor enabling circuits UU1~UU7.

Each of the lower-bit enabling circuit LE1~LE4 is configured to receive one of the lower-bit enabling signals EL1~EL4 to control one of the lower-bit capacitors CL1~CL4.

The control circuit 110 can enable or disable the lower-bit capacitors CL1~CL4 such that the lower-bit capacitors CL1~CL4 are coupled to different reference voltages VREF. In an embodiment, the reference voltages VREF may include a non-ground level voltage NGND and a ground level voltage GND. The control circuit 110 controls at least one of the lower-bit enabling signals EL1~EL4 to be the enabling state to enable the corresponding lower-bit capacitors CL1~CL4 to be coupled to the non-ground level voltage NGND. On the contrary, the control circuit 110 controls at least one of the lower-bit enabling signals EL1~EL4 to be the disabling state to disable the corresponding lower-bit capacitors CL1~CL4 to be coupled to the ground level voltage GND.

Each of the residue capacitor enabling circuit RE1~RE2 is configured to receive one of the higher-bit enabling signals to control one of the residue capacitors CD1~CD2 to be coupled to different reference voltages VREF according to the enabling state and the disabling state of the higher-bit enabling signals (e.g., enabled to be coupled to the non-ground level voltage NGND and disabled to be coupled to the ground level voltage GND). Since the residue capacitor CD1 is configured to the higher-bit capacitors CH1, the residue capacitor enabling circuit RE1 receives the higher-bit enabling signal EH1. Since the residue capacitors CD2 is configured to the higher-bit capacitor CH3, the residue capacitor enabling circuit RE2 receives the higher-bit enabling signal EH3.

Each of the multiplexers MU1~MU7 is configured to receive the higher-bit enabling signals EH1~EH3 and receive one of a plurality of allocation signals AS1~AS7 to select one of the higher-bit enabling signals EH1~EH3 to be outputted accordingly. The allocation signals AS1~AS7 are generated by the control circuit 110 according to the sorting result.

Each of the unit capacitor enabling circuits UU1~UU7 is configured to receive one of the higher-bit enabling signals EH1~EH3 outputted by one of the multiplexers MU1~MU7 to control one of the unit capacitors CU1~CU7.

Take the embodiment illustrated in FIG. 3A to FIG. 3D, in which the sorting process only includes two sorting stages as an example, the higher-bit capacitor CH1 is configured by the unit capacitors CU3, CU4, CU1 and CU5. The control circuit 110 generates the allocation signals AS3, AS4, AS1 and AS5 such that each of the multiplexers MU3, MU4, MU1 and MU5 selects the higher-bit enabling signal EH1 to be outputted.

The higher-bit capacitor CH2 is configured by the unit capacitors CU6 and CU2. The control circuit 110 generates the allocation signals AS6 and AS2 such that each of the multiplexers MU6 and MU2 selects the higher-bit enabling signal EH2 to be outputted.

The higher-bit capacitor CH3 is configured by the unit capacitor CU7. The control circuit 110 generates the allocation signal AS7 such that the multiplexer MU7 select the higher-bit enabling signal EH3 to be outputted.

As a result, when the higher-bit capacitor CH1 is supposed to be enabled, the control circuit 110 controls the higher-bit enabling signal EH1 to have the enabling state such that the multiplexers MU3, MU4, MU1 and MU5 output the higher-bit enabling signal EH1 having the high state. The unit capacitors CU3, CU4, CU1 and CU5 and the residue capacitor CD1 are enabled (coupled to the non-ground level voltage NGND) to be configured to be the higher-bit capacitor CH1. On the contrary, when the higher-bit capacitor CH1 is supposed to be disabled, the control circuit 110 controls the higher-bit enabling signal EH1 to have the disabling state and disable the unit capacitors CU3, CU4, CU1 and CU5 and the residue capacitor CD1 (coupled to the ground level voltage GND) by using the mechanism described above.

When the higher-bit capacitor CH2 is supposed to be enabled, the control circuit 110 controls the higher-bit enabling signal EH2 to have the enabling state such that the multiplexers MU6 and MU2 output the higher-bit enabling signal EH2 having the high state to enable the unit capacitors CU6 and CU2 to be configured to be higher-bit capacitor CH2. On the contrary, when the higher-bit capacitor CH2 is supposed to be disabled, the control circuit 110 controls the higher-bit enabling signal EH2 to have the disabling state and disable the unit capacitors CU6 and CU2 by using the mechanism described above.

When the higher-bit capacitor CH3 is supposed to be enabled, the control circuit 110 controls the higher-bit enabling signal EH3 to have the enabling state such that the multiplexer MU7 outputs the higher-bit enabling signal EH3 having the high state to enable the unit capacitor CU7 and the residue capacitor CD2 to be configured to be higher-bit capacitor CH3. On the contrary, when the higher-bit capacitor CH3 is supposed to be disabled, the control circuit 110 controls the higher-bit enabling signal EH3 to have the disabling state and disable the unit capacitor CU7 and the residue capacitor CD2 by using the mechanism described above.

(3) The optimization of the linearity parameter: in an embodiment, the linearity parameter is an integral non-linearity (INL) parameter, a effective number of bits (ENOB) parameter, a differential nonlinearity (DNL) parameter, a signal-to-noise-and-distortion ratio (SNDR) parameter or a spurious-free dynamic range (SFDR) parameter.

For example, each of the 7 unit capacitors has random offsets of 2% Gaussian distribution. The INL offset can drop from 0.87 least significant bit (LSB), which corresponds to the condition that no sorting is performed, to 0.67 LSB, which corresponds to the condition that two sorting stages are performed. The average effective number of bits can increase by 0.4 bits. The minimum effective number of bits can increase by 0.55 bits.

According to the above description, by the operation of the sorting process and the enabling of the capacitors, the linearity of the higher-bit capacitors of the capacitor array is optimized.

It is appreciated that the numbers of the capacitors and the values of the capacitances described above can be different depending on practical requirements and are not limited thereto. For example, the number of the unit capacitors required by the higher-bit capacitors can be determined by the higher-bit capacitances required by the higher-bit capacitors and the unit capacitance of each of the unit capacitors. The residue capacitance of the residue capacitor can be determined by the higher-bit capacitances required by the higher-bit capacitors and the total capacitance of the configured unit capacitors. Each of the configured higher-bit capacitors may include at least one unit capacitors and at least one residue capacitor and may also not include any residue capacitor.

Moreover, the sorting method described above is merely an example. The present invention is not limited thereto.

In an embodiment, before the sorting process in the initializing mode, the control circuit 100 may only enable one of the unit capacitors and selectively enable the lower-bit capacitors based on the successive approximation mechanism to generate the digital output signal DOUT to measure the unit capacitance. Since the SAADC circuit 100 itself includes the comparator 130, no additional circuit is needed to measure the unit capacitance.

In other embodiments, the control circuit 110 may selectively enable a unit capacitor and disable another unit capacitor in the initializing mode such that a difference voltage is generated at the analog output signal ANO generated by the capacitor array 120. The comparator 130 determines whether the difference voltage is larger than or smaller than the virtual ground voltage to obtain the relations of the amounts of the capacitances accordingly.

Figure 4:
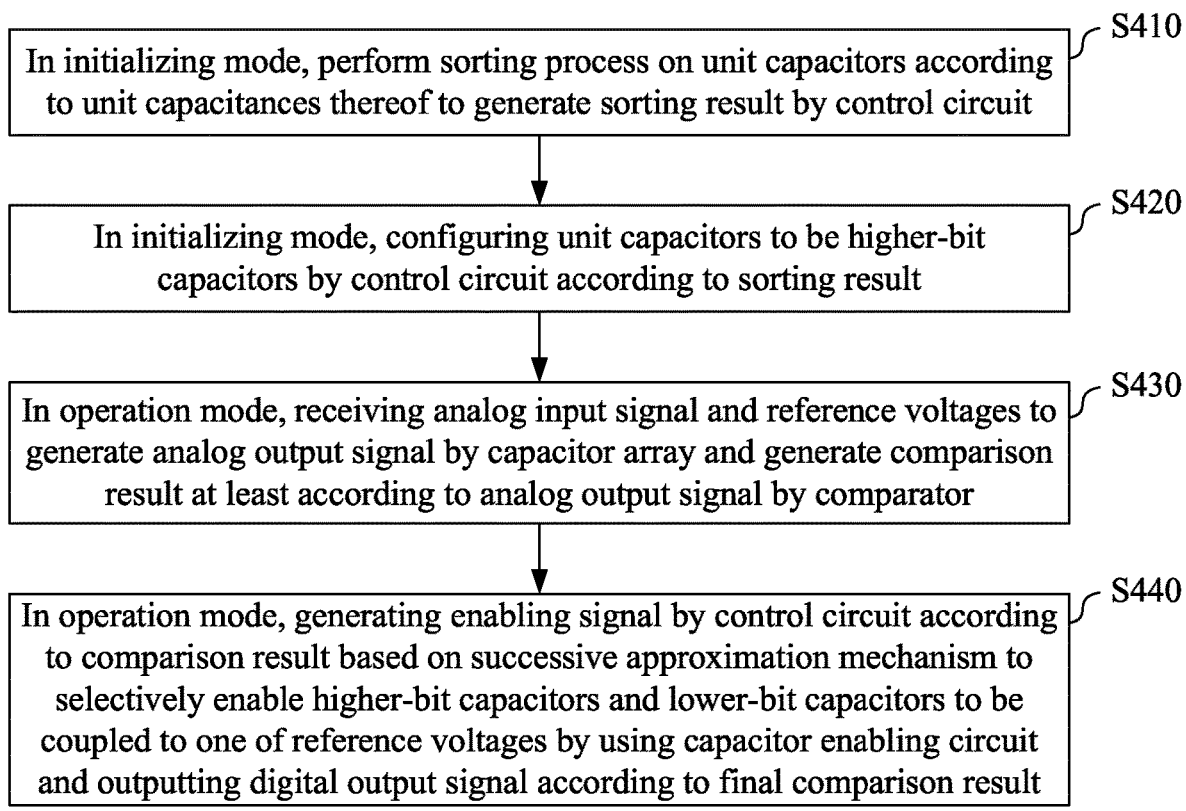
FIG. 4 is a flow chart of a SAADC method having optimized linearity according to an embodiment of the present invention.

Reference is now made to FIG. 4. FIG. 4 is a flow chart of a SAADC method 400 having optimized linearity according to an embodiment of the present invention. The SAADC method 400 can be used in such as, but not limited to, the SAADC circuit 100 in FIG. 1A or FIG. 1B. As illustrated in FIG. 4, an embodiment of the SAADC method 400 includes the following steps.

In step S410, in the initializing mode, the sorting process is performed on the unit capacitors CU1~CU7 according to the unit capacitances thereof to generate the sorting result by the control circuit 110.

In step S420, in the initializing mode, the unit capacitors CU1~CU7 are configured to be the higher-bit capacitors CH1~CH3 by the control circuit 110 according to the sorting result such that the linearity parameter of the higher-bit capacitors CH1~CH3 is within the predetermined range.

In step S430, in the operation mode, the analog input signal ANI and the reference voltages VREF are received to generate the analog output signal ANO by the capacitor array 120 and a comparison result CR is generated at least according to the analog output signal ANO by the comparator 130.

In step S440, in the operation mode, the enabling signal EN is generated by the control circuit 110 according to the comparison result CR based on the successive approximation mechanism to selectively enable the higher-bit capacitors CH1~CH3 and the lower-bit capacitors CL1~CL4 to be coupled to one of the reference voltages VREF by using the capacitor enabling circuit 220 and outputs the digital output signal DOUT according to the final comparison result CR.

It is appreciated that the embodiments described above are merely an example. In other embodiments, it should be appreciated that many modifications and changes may be made by those of ordinary skill in the art without departing, from the spirit of the disclosure.

In summary, the present invention discloses the SAADC circuit and the SAADC method having optimized linearity to sort unit capacitors and configure the sorted unit capacitors with the corresponding residue capacitor by the control circuit such that the higher-bit capacitors configured accordingly have an optimized linearity.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A successive approximation analog to digital conversion (SAADC) circuit having optimized linearity, comprising:
a control circuit;
at least one capacitor array comprising:
a lower-bit capacitor array comprising a plurality of lower-bit capacitors;
a higher-bit capacitor array comprising a plurality of unit capacitors each having a unit capacitance approximately equal to each other; and
a capacitor enabling circuit; and
a comparator electrically coupled between the capacitor array and the control circuit;
wherein in an initializing mode, the control circuit performs a sorting process on the unit capacitors according to the unit capacitances thereof to generate a sorting result to configure the unit capacitors to be a plurality of higher-bit capacitors according to the sorting result such that a linearity parameter of the higher-bit capacitors is within a predetermined range, wherein:
the sorting process performed on the unit capacitors by the control circuit comprises K sorting stages each correspondingly processing a plurality of items to be processed, in which K is an integer larger than or equal to 1, and the items to be processed corresponding to a first sorting stage are the unit capacitances of the unit capacitors;
in each of the K sorting stages, the control circuit performs a sorting operation and a combining operation on the items to be processed, in which the sorting operation sorts a total capacitance of the unit capacitors comprised by each of the items to be processed in ascending order or in descending order to generate a plurality of sorted items, and the combining operation combines a plurality pairs of the sorted items to generate a plurality of combined items, in which for each pair of the sorted items, one the sorted items is larger than or equal to a median of the sorted items and the other one of the sorted items is smaller than or equal to the median; and
the combined items generated in each of the first to K−1-th sorting stages serve as the items to be processed of a next one of the sorting stages, and the combined items generated in the K-th sorting stages serve as a plurality of items to be allocated; and
in an operation mode, the capacitor array receives an analog input signal and a plurality of reference voltage to generate an analog output signal, the comparator generates a comparison result at least according to the analog output signal and the control circuit generates an enabling signal according to the comparison result based on the successive approximation mechanism to selectively enable the higher-bit capacitors and the lower-bit capacitors to be coupled to one of the reference voltages by using the capacitor enabling circuit and outputs a digital output signal according to the final comparison result.

2. The SAADC circuit of claim 1, wherein the control circuit is further configured to only enable one of the unit capacitors and selectively enable the lower-bit capacitors based on the successive approximation mechanism to generate the digital output signal to measure the unit capacitance.

3. The SAADC circuit of claim 1, wherein for each of the K sorting stages as a present sorting stage, after the sorting operation is finished, the control circuit determines a specific one of the higher-bit capacitors to be configured that requires an odd number of the sorted items to be allocated thereto as an odd capacitor of the present sorting stage;
when the number of the odd capacitor in the present sorting stage is more than one, the unit capacitors of at least one of the middlemost sorted items are allocated to the odd capacitor such that the combining operation is performed subsequently.

4. The SAADC circuit of claim 3, wherein the control circuit allocates the unit capacitors that the items to be allocated generated in the K-th sorting stage corresponds to to a plurality of remained non-odd capacitors.

5. The SAADC circuit of claim 4, wherein when the number of the sorted items is N, the combining operation pairs the A-th sorted item and the N+1-A-th sorted item under the condition that A in turn increments from 1 to $\lfloor N/2 \rfloor$, in which N is a positive integer.

6. The SAADC circuit of claim 1, wherein the enabling signal comprises a plurality of higher-bit enabling signals and a plurality of lower-bit enabling signals each having an enabling state and a disabling state, the higher-bit enabling signals respectively corresponding to one of the higher-bit capacitors and the lower-bit enabling signals respectively corresponding to one of the lower-bit capacitors, the capacitor enabling circuit comprising:
a plurality of lower-bit enabling circuit each configured to receive one of the lower-bit enabling signals to control one of the lower-bit capacitors to be coupled to one of the reference voltages;
a plurality of multiplexers each configured to receive the higher-bit enabling signals and receive one of a plurality of allocation signals to select one of the higher-bit enabling signals to be outputted accordingly, wherein the allocation signals is generated by the control circuit according to the sorting result;
a plurality of unit capacitor enabling circuits each configured to receive one of the higher-bit enabling signals outputted by one of the multiplexers to control one of the unit capacitors to be coupled to one of the reference voltages.

7. The SAADC circuit of claim 6, wherein the higher-bit capacitor array further comprises at least one residue capacitor having a residue capacitance smaller than or equal to the unit capacitance, the control circuit being configured to configure the unit capacitors and the residue capacitor to be the higher-bit capacitors according to the sorting result, wherein each of the higher-bit capacitors comprises at least one of the unit capacitors;
the capacitor enabling circuit further comprises at least one residue capacitor enabling circuit configured to receive one of the higher-bit enabling signals to control the residue capacitor to be coupled to one of the reference voltages.

8. The SAADC circuit of claim 1, wherein the linearity parameter is an integral non-linearity (INL) parameter, a effective number of bits (ENOB) parameter, a differential nonlinearity (DNL) parameter, a signal-to-noise-and-distortion ratio (SNDR) parameter or a spurious-free dynamic range (SFDR) parameter.

9. The SAADC circuit of claim 1, wherein when the at least one capacitor array comprises only a single capacitor array, the comparator performs comparison on the analog output signal and a virtual ground voltage level to generate the comparison result;
when the at least one capacitor array comprises two differential capacitor arrays, the comparator performs comparison on the analog output signals of the two differential capacitor arrays to generate the comparison result.

10. A SSADC method having optimized linearity used in a SSADC circuit, the SSADC circuit comprising a control circuit, at least one capacitor array and a comparator, the capacitor array comprising a lower-bit capacitor array, a higher-bit capacitor array and a capacitor enabling circuit, the lower-bit capacitor array comprising a plurality of lower-bit capacitors, the higher-bit capacitor array comprising a plurality of unit capacitors each having a unit capacitance approximately equal to each other, the comparator being electrically coupled between the capacitor array and the control circuit, and the SSADC method comprising:
in an initializing mode, performing a sorting process on the unit capacitors according to the unit capacitances thereof to generate a sorting result by the control circuit, wherein the performing of the sorting process comprises:
performing the sorting process on the unit capacitors that comprises K sorting stages each correspondingly processing a plurality of items to be processed by the control circuit, in which K is an integer larger than or equal to 1, and the items to be processed corresponding to the first sorting stage are the unit capacitances of the unit capacitors; and
in each of the K sorting stages, performing a sorting operation and a combining operation on the items to be processed by the control circuit, in which the sorting operation sorts a total capacitance of the unit capacitors comprised by each of the items to be processed in ascending order or in descending order to generate a plurality of sorted items, and the combining operation combines a plurality pairs of the sorted items to generate a plurality of combined items, in which for each pair of the sorted items, one the sorted items is larger than or equal to a median of the sorted items and the other one of the sorted items is smaller than or equal to the median, wherein the combined items generated in each of the first to the K−1-th sorting stages serve as the items to be processed of a next one of the sorting stages, and the combined items generated in the K-th sorting stages serve as a plurality of items to be allocated;
in the initializing mode, configuring the unit capacitors to be a plurality of higher-bit capacitors by the control circuit according to the sorting result such that a linearity parameter of the higher-bit capacitors is within a predetermined range;
in an operation mode, receiving an analog input signal and a plurality of reference voltage to generate an analog output signal by the capacitor array and generating a comparison result at least according to the analog output signal by the comparator; and
in the operation mode, generating an enabling signal by the control circuit according to the comparison result based on the successive approximation mechanism to selectively enable the higher-bit capacitors and the lower-bit capacitors to be coupled to one of the reference voltages by using the capacitor enabling circuit and outputs a digital output signal according to the final comparison result.

11. The SAADC method of claim 10, further comprising:
only enabling one of the unit capacitors and selectively enabling the lower-bit capacitors based on the successive approximation mechanism by the control circuit to generate the digital output signal to measure the unit capacitance.

12. The SAADC method of claim 10, further comprising:
for each of the K sorting stages as a present sorting stage, after the sorting operation is finished, determining a specific one of the higher-bit capacitors to be configured that requires an odd number of the sorted items to be allocated thereto as an odd capacitor of the present sorting stage by the control circuit; and when the number of the odd capacitor in the present sorting stage is more than one, allocating the unit capacitors of at least one of the middlemost sorted items to the odd capacitor such that the combining operation is performed subsequently.

13. The SAADC method of claim 12, further comprising:
allocating the unit capacitors that the items to be allocated generated in the K-th sorting stage corresponds to to a plurality of remained non-odd capacitors by the control circuit.

14. The SAADC method of claim 13, wherein when the number of the sorted items is N, the combining operation pairs the A-th sorted item and the N+1-A-th sorted item under the condition that A in turn increments from 1 to $\lfloor N/2 \rfloor$, in which N is a positive integer.

15. The SAADC method of claim 10, wherein the enabling signal comprises a plurality of higher-bit enabling signals and a plurality of lower-bit enabling signals each having an enabling state and a disabling state, the higher-bit enabling signals respectively corresponding to one of the higher-bit capacitors and the lower-bit enabling signals respectively corresponding to one of the lower-bit capacitors, the SAADC method further comprising:
receiving one of the lower-bit enabling signals to control one of the lower-bit capacitors to be coupled to one of the reference voltages by each of a plurality of lower-bit enabling circuit comprised by the capacitor enabling circuit;

receiving the higher-bit enabling signals and receiving one of a plurality of allocation signals by each of a plurality of multiplexers comprised by the capacitor enabling circuit to select one of the higher-bit enabling signals to be outputted accordingly, wherein the allocation signals is generated by the control circuit according to the sorting result; and receiving one of the higher-bit enabling signals outputted by one of the multiplexers to control one of the unit capacitors to be coupled to one of the reference voltages by each of a plurality of unit capacitor enabling circuits comprised by the capacitor enabling circuit.

16. The SAADC method of claim 15, wherein the higher-bit capacitor array further comprises at least one residue capacitor having a residue capacitance smaller than or equal to the unit capacitance, the SAADC method further comprising:
configuring the unit capacitors and the residue capacitor to be the higher-bit capacitors according to the sorting result by the control circuit, wherein each of the higher-bit capacitors comprises at least one of the unit capacitors;

receiving one of the higher-bit enabling signals to control the residue capacitor to be coupled to one of the reference voltages by at least one residue capacitor enabling circuit further comprised by the capacitor enabling circuit.

17. The SAADC method of claim 10, wherein the linearity parameter is an integral non-linearity parameter, a effective number of bits parameter, a differential nonlinearity parameter, a signal-to-noise-and-distortion ratio parameter or a spurious-free dynamic range parameter.

18. The SAADC method of claim 10, further comprising:
when the at least one capacitor array comprises only a single capacitor array, performing comparison on the analog output signal and a virtual ground voltage level to generate the comparison result by the comparator; and when the at least one capacitor array comprises two differential capacitor arrays, performing comparison on the analog output signals of the two differential capacitor arrays to generate the comparison result by the comparator.

* * * * *